(12) United States Patent
Hori

(10) Patent No.: US 6,798,247 B2
(45) Date of Patent: Sep. 28, 2004

(54) OUTPUT BUFFER CIRCUIT

(75) Inventor: Chikahiro Hori, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/418,107

(22) Filed: Apr. 18, 2003

(65) Prior Publication Data

US 2003/0227297 A1 Dec. 11, 2003

(30) Foreign Application Priority Data

Jun. 5, 2002 (JP) ........................................ 2002-163758

(51) Int. Cl.[7] ......................................... H03K 19/0175
(52) U.S. Cl. ............................. 326/83; 326/35; 326/112
(58) Field of Search ......................... 326/26–27, 30–31, 326/34–35, 83, 112

(56) References Cited

U.S. PATENT DOCUMENTS

| | | | | | |
|---|---|---|---|---|---|
| 5,471,150 | A | * | 11/1995 | Jung et al. ..................... | 326/87 |
| 5,633,600 | A | * | 5/1997 | Ohnishi ........................ | 326/17 |
| 5,699,000 | A | * | 12/1997 | Ishikuri ....................... | 327/108 |
| 5,889,707 | A | * | 3/1999 | Yang ....................... | 365/189.05 |
| 6,225,844 | B1 | * | 5/2001 | Fujiwara ..................... | 327/170 |
| 6,720,794 | B2 | * | 4/2004 | Seike .......................... | 326/27 |
| 2001/0017554 | A1 | * | 8/2001 | Tsuji .......................... | 327/112 |
| 2001/0026178 | A1 | * | 10/2001 | Itoh et al. .................... | 327/112 |

FOREIGN PATENT DOCUMENTS

| | | |
|---|---|---|
| JP | 5-14169 | 1/1993 |
| JP | 2001-292056 | 10/2001 |

* cited by examiner

*Primary Examiner*—Michael Tokar
*Assistant Examiner*—Khai Nguyen
(74) *Attorney, Agent, or Firm*—Oblon, Spivak, McClelland, Maier & Neustadt, P.C.

(57) ABSTRACT

An output buffer circuit disclosed herein includes a buffer supplied with an input signal and outputting an output signal from an output terminal; a driving assistant buffer including a first MISFET provided at one of a first position and a second position, the first position being between the output terminal and a first power supply and the second position being between the output terminal and a second power supply; a first logic circuit configured to perform a logic operation based on a first logical threshold using the output signal to output a first logic signal; a second logic circuit configured to perform the same logic operation as the first logic circuit based on a second logical threshold using the output signal to output a second logic signal; and a third logic circuit outputting a control signal to control the first MISFET and including second and third MISFETs connected in series, the first logic signal being inputted to a gate of the second MISFET and the second logic signal being inputted to a gate of the third MISFET.

17 Claims, 12 Drawing Sheets

OUTPUT BUFFER CIRCUIT

CROSS REFERENCE TO RELATED APPLICATION

This application claims benefit of priority under 35 U.S.C. §119 to Japanese Patent Application No. 2002-163758, filed on Jun. 5, 2002, the entire contents of which are incorporated by reference herein.

BACKGROUND OF THE INVENTION

1. Field of the Invention

The present invention relates to an output buffer circuit including a driving capability control circuit which performs control to change driving capability of an output buffer during its operation.

2. Description of the Related Art

With a recent remarkable increase in the operation speed of an integrated circuit, a high-speed output buffer has also been demanded of its output buffer. To meet this demand, improvements in the driving capability of the output buffer are made, but the improvements caused the problem of noises such as overshoot, undershoot, and ringing.

Hence, the output buffer has been faced the contradictory demands, that is, an improvement in driving force and a reduction in noise at the same time.

One of solutions thereto is to change the driving capability of the output buffer during its operation. The increase in speed demanded of the output buffer of a digital circuit means that the signal reaches earlier to the logical threshold of the next stage, and therefore high driving capability is required for the output buffer from the start of state transition to its arrival at the logical threshold level of the next stage.

On the other hand, noise tends to occur after the output signal reaches the logical threshold of the next stage, and especially when the driving capability is high, noise markedly occurs. To reduce the noise, it is effective to reduce the driving capability of the output buffer after the signal reaches the logical threshold of the next stage.

FIG. 6 shows the circuit configuration of a related complementary MIS output buffer control circuit. An input 101 is connected to a main buffer 103 of an output buffer via a subbuffer 102. The main buffer 103 is connected to an output terminal 104 and drives a load capacitance 105. A driving assistant buffer 106 including a P-channel MISFET (hereinafter referred to as a P-MIS) $106_1$ for enhancing rise driving force and an N-channel MISFET (hereinafter referred to as an N-MIS) $106_2$ for enhancing fall driving force is connected in parallel with the main buffer 103.

A two-input NAND 108 is connected to a gate terminal of the P-MIS $106_1$, and a two-input NOR 109 is connected to a gate terminal of the N-MIS $106_2$. Both inputs of the NAND 108 and the NOR 109 are the input 101 and an inverted output by an inverter 107 of the output terminal 104. Namely, on/off control of the driving assistant buffer 106 is performed by the input 101 and a feedback from the output terminal 104.

Incidentally, a parasitic inductance 110 such as a pin, a bonding wire, or the like of an integrated circuit package exists between the output terminal 104 and the load capacitance 105.

Now, the operation of the driving assistant buffer 106 during an output transition is explained. First, when the input 101 is "H" and both its input and output are stable, the output terminal 104 is also "H", and hence an output of the inverter 107 is "L". Accordingly, an output of the NAND 108 is "H", and an output of the NOR 109 is "L", whereby both the P-MIS $106_1$ and the N-MIS $106_2$ are turned off, that is, the driving assistant buffer 106 does not function.

When the input 101 changes from "H" to "L", the output terminal 104 also starts to change from "H" to "L", but there exists an output delay time which depends on the magnitude of the load capacitance 105. Accordingly, the output of the inverter 107 remains "H" immediately after the change of the input 101 from "H" to "L". Therefore, both inputs of the NOR 109 are "L" and the output thereof is "H", so that the N-MIS $106_2$ is turned on.

On the other hand, since the input 101 becomes "L", the output of the NAND 108 remains "H", and the P-MIS $106_1$ remains off.

Namely, during this period, the driving assistant buffer 106 enhances the driving force which makes an output of the main buffer 103 to fall by turning only the N-MIS $106_2$ on.

Thereafter, when the level of the output terminal 104 exceeds a logical threshold of the inverter 107, the output of the inverter 107 becomes "H", and the output of the NOR 109 becomes "L", whereby the N-MIS $106_2$ is turned off. Thus, the operation of the driving assistant buffer 106 is completed. In other words, the driving assistant buffer 106 functions from when the level of the output terminal 104 started to change until it exceeds the logical threshold of the inverter 107.

FIG. 7 is a operation waveform diagram of the output buffer circuit. At early stages of the fall of an output waveform, the output waveform sharply falls since both the main buffer 103 and the driving assistant buffer 106 operate, but when the output level exceeds the logical threshold of the inverter 107, the driving assistant buffer 106 stops its operation, and hence the output change becomes gradual.

Incidentally, when the input 101 changes from "L" to "H", the output of the NAND 108 stays "L" until the level of the output terminal 104 exceeds the logical threshold of the inverter 107, and the P-MIS $106_1$ is turned on to thereby increase the speed of output change immediately after rise (not shown in FIG. 7).

Thus, in the circuit in FIG. 6, both the inverter 107 and the NOR 109 or the NAND 108 perform the operation of controlling the driving force of the output buffer in such a manner that the driving force is increased immediately after the output transition and reduced from the middle of the transition.

The related complementary MIS output buffer control circuit, however, has a problem that internal oscillation tends to occur when the driving force is reduced in the middle of the transition. This is because the rate of current change per unit time increases due to a sharp change in driving force and counter electromotive force generated by the product of the current change rate and the parasitic inductance 110 increases to thereby return the output change in the opposite direction.

The output considered as temporarily exceeding the logical threshold of the inverter 107 by this counter electromotive force is considered again as having the logical threshold or less, and the driving assistant buffer 106 is turned on again. Then, the counter electromotive force which acts in the opposite direction to the previous direction is generated, and this time it acts so as to turn off the driving assistant buffer 106. The repetition of this operation causes oscillation, and FIG. 8 shows an example of its simulation.

A factor which causes the sharp change in driving force is a high gain of the driving force control circuit including the inverter 107 and the NAND 108 or the NOR 109 which controls the driving assistant buffer 106.

FIG. 9 shows a portion including the inverter 107 and the NOR 109 extracted from the driving force control circuit with a case when the output terminal 104 changes from "H" to "L" as an example, and herein the NOR 109 is represented by a MISFET.

In FIG. 9, immediately after the change of the input 101 from "H" to "L", the output terminal 104 still remains "H", and a NOR input $109_1$ which is an inverted output of the inverter 107 remains "L". Accordingly, a NOR output $109_2$ is "H".

Thereafter, when the output terminal 104 changes to "L", the NOR input $109_1$ changes to "H". Then, a P-MIS $109_3$ changes its state from ON to OFF, and an N-MIS $109_4$ changes its state from OFF to ON, whereby the NOR output $109_2$ becomes "L". At this time, changes in the states of the P-MIS $109_3$ and the N-MIS $109_4$ simultaneously occur, and hence the change of the NOR output $109_2$ from "L" to "H" is sharp.

FIG. 10 shows the voltage transition of the NOR output $109_2$ with respect to the voltage transition of the output terminal 104. The sharper change of the output relative to the change of the input indicates that the gain of this driving force control circuit is high.

Since the output change of the NOR output $109_2$ is sharp, the N-MIS $106_2$ of the driving assistant buffer 106 is suddenly turned off during the voltage of 104 is falling down (from right side of the FIG. 10 to the left), and the driving force to the output terminal 104 is reduced brutally.

Due to the high gain of this driving force control circuit, the slope of the output signal of the control circuit is almost constant irrespective of the slope of the voltage transition of the output terminal 104. FIG. 11 shows output waveforms (output waveform 1, output waveform 2) of the NOR output $109_2$ with respect to two inputs (input waveform 1, input waveform 2) having different slopes of the output terminal 104, and it is found that the slopes of the output waveform 1 and the output waveform 2 are almost the same.

Concerning oscillation caused by the counter electromotive force of the parasitic inductance 110, the problem is that the slope of the output signal of the control circuit is steep with respect to a waveform having a gentle slope like the input waveform 2 in FIG. 11. In the case of a waveform in which the slope of the voltage change of the output terminal 104 is steep, even if some counter electromotive force occurs, the voltage level of the output terminal 104 changes at a speed exceeding the speed of the occurrence, and hence the effects of the counter electromotive force are counteracted, but in the case of a waveform having a gentle slope, the voltage level of the output terminal 104 does not change to such an extent as to counteract the effects of the counter electromotive force, and hence oscillation occurs.

On the other hand, in the case of the waveform in which the slope of the voltage change of the output terminal 104 is steep, it is desirable that the output slope of the driving force control circuit be also steep in order to turn off the driving assistant buffer 106 early. If not, the driving force remains enhanced even in the situation in which noise has to be concerned.

Incidentally, although the case where the input 101 changes from "H" to "L" is explained so far as an example, also in a case where the input 101 changes from "L" to "H", oscillation also occurs in the output terminal 104 due to the high gain of the driving force control circuit including the inverter 107 and the NAND 108 which controls the P-MIS $106_1$.

Namely, there is a problem that oscillation occurs in the output terminal at the time of switching of the control circuit of the complementary MIS output buffer.

FIG. 12 shows a circuit diagram of a circuit configuration of another related complementary MIS output buffer circuit. The complementary MIS output buffer circuit of FIG. 12 is different from the complementary MIS output buffer circuit of FIG. 6 in that inverters 200 and 202 are provided instead of the inverter 107. That is, an input terminal of the inverter 200 is connected to the output terminal 104, and an output terminal of the inverter 200 is connected to the NOR 109. An input terminal of the inverter 202 is connected to the output terminal 104, and an output terminal of the inverter 202 is connected to the NAND 108.

A logical threshold of the inverter 200 is different from that of the inverter 202. As a result, a switching timing of an on/off-state of the P-MIS $106_1$ can be different from a switching timing of an on/off-state of the N-MIS $106_2$. However, there is a problem that oscillation occurs in the output terminal at the time of switching in the same manner as mentioned above.

SUMMARY OF THE INVENTION

In order to accomplish the aforementioned and other objects, according to one aspect of the present invention, an output buffer circuit, comprises:

a buffer which is supplied with an input signal and which outputs an output signal from an output terminal;

a driving assistant buffer which includes a first MISFET provided at one of a first position and a second position, the first position being between the output terminal and a first power supply and the second position being between the output terminal and a second power supply;

a first logic circuit which is connected to the output terminal and which has a first logical threshold, the first logic circuit configured to perform a logic operation based on the first logical threshold using the output signal so as to output a first logic signal;

a second logic circuit which is connected to the output terminal and which has a second logical threshold higher than the first logical threshold, the second logic circuit configured to perform the same logic operation as the first logic circuit based on the second logical threshold using the output signal so as to output a second logic signal; and a third logic circuit which is connected to a gate of the first MISFET and which outputs a control signal so as to control the first MISFET, the third logic circuit including a second MISFET of a P-channel and a third MISFET of an N-channel which are connected in series between a third power supply and a fourth power supply, the first logic signal being inputted to a gate of the second MISFET and the second logic signal being inputted to a gate of the third MISFET.

DETAILED DESCRIPTION OF THE EMBODIMENTS

Embodiments will be explained below with reference to the drawings.

(First Embodiment)

Figure 1:
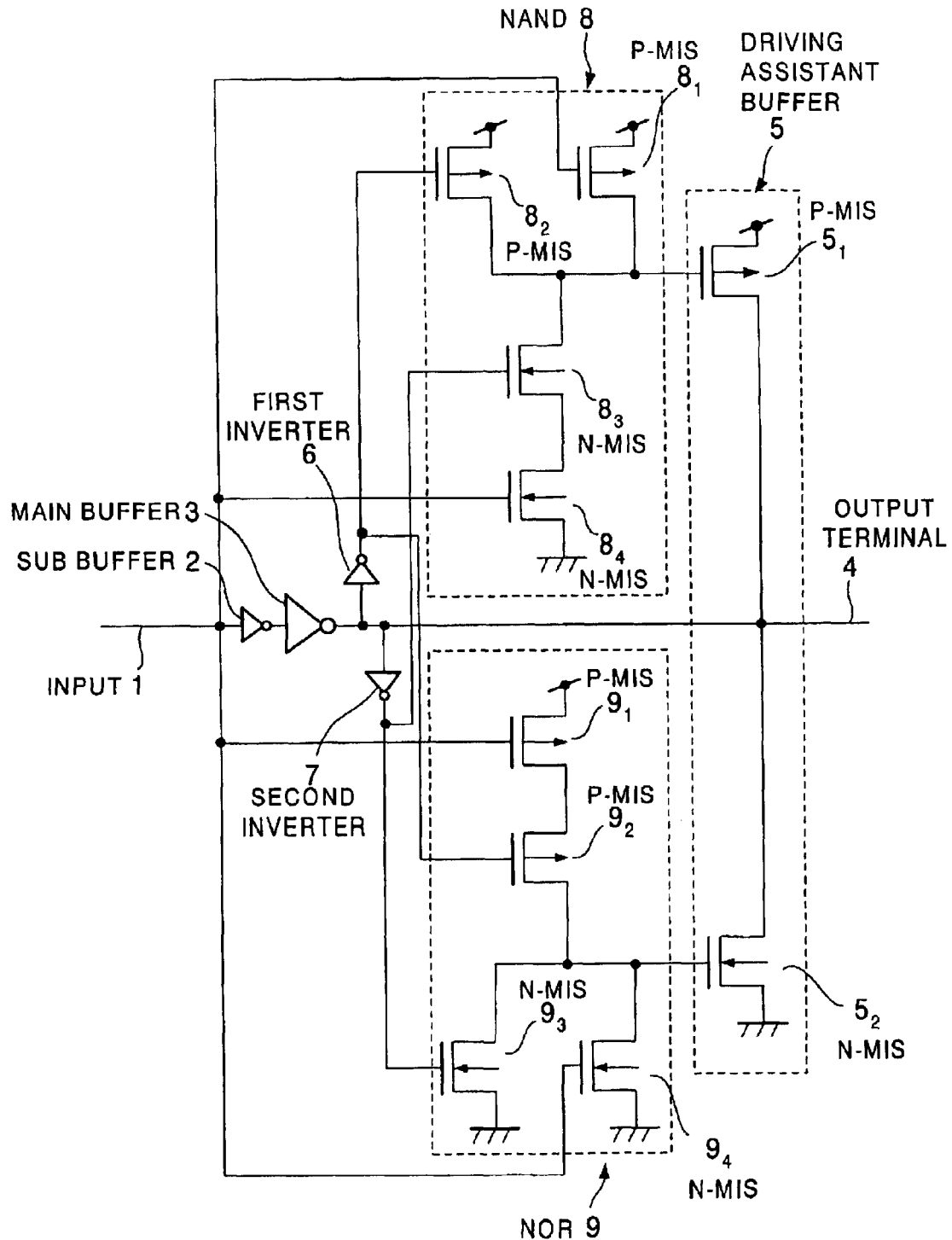
FIG. 1 is a circuit diagram of a complementary MIS output buffer circuit according to a first embodiment.

FIG. 1 is a circuit diagram of a complementary MIS output buffer circuit according to a first embodiment.

In FIG. 1, an input 1 is connected to a main buffer 3 of an output buffer via a subbuffer 2. The main buffer 3 is connected to an output terminal 4 and drives a load capacitance (not shown). A driving assistant buffer 5 including a P-MIS $5_1$ for enhancing rise driving force and an N-MIS $5_2$ for enhancing fall driving force is connected to the output terminal 4.

A two-input NAND 8 is connected to a gate terminal of the P-MIS $5_1$, and a two-input NOR 9 is connected to a gate terminal of the N-MIS $5_2$.

The input 1 is connected to gate terminals of a P-MIS $8_1$ and an N-MIS $8_4$, an output of a first inverter 6 is connected to a gate terminal of a P-MIS $8_2$, and an output of a second inverter 7 is connected to a gate terminal of an N-MIS $8_3$, and then these MISFETs constitutes the NAND 8.

The input 1 is connected to gate terminals of a P-MIS $9_1$ and an N-MIS $9_4$, the output of the first inverter 6 is connected to a gate terminal of a P-MIS $9_2$, and the output of the second inverter 7 is connected to a gate terminal of an N-MIS $9_3$, out of MISFETs constituting the NOR 9.

Both inputs of the first inverter 6 and the second inverter 7 are connected to the output terminal 104, but their logical thresholds are different. In a usual complementary MIS circuit, the logical threshold is designed to be one half of a power supply voltage VDD, that is, ½ VDD, but in this case, the logical threshold of the first inverter 6 is designed to be lower than the usual value, and the logical threshold of the second inverter 7 is designed to be higher than the usual value.

The operation of this embodiment will be explained below, but herein particularly the NOR 9 which controls the driving of the N-MIS $5_2$ for enhancing fall driving force in the driving assistant buffer 5 will be explained.

Figure 2:
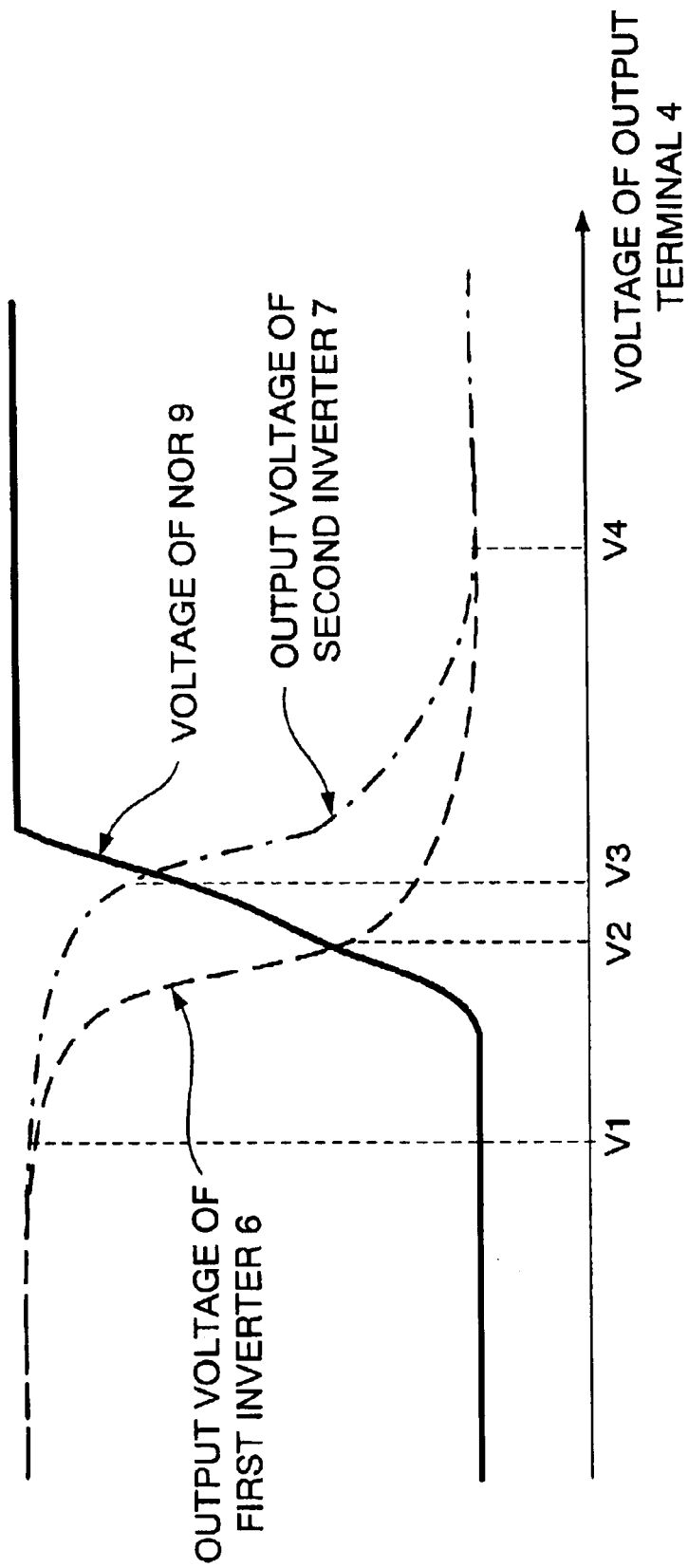
FIG. 2 is a first operation waveform diagram of the complementary MIS output buffer circuit according to the first embodiment.

First, the functions of the first inverter 6 and the second inverter 7 will be explained referring to FIG. 2. FIG. 2 shows the output voltage of the first inverter 6 and the second inverter 7. The horizontal axis of FIG. 2 is the voltage of the output terminal 4, that is, input voltages of the first inverter 6 and the second inverter 7. It also shows the output voltage of the NOR 9 when the input 1 is fixed to "L".

As shown in FIG. 2, when the voltage of the output terminal 4 gradually decrease ("H" to "L": from right side of the FIG. 2, to the left), the inverter 7 having the higher logical threshold rises earlier, and the inverter 6 having the lower logical threshold rises later. Accordingly, when the voltage of the output terminal 4 is between V4 and V1 in FIG. 2, the first inverter 6 and the second inverter 7 have different output voltage with respect to the same input voltage.

Especially, when the voltage of the output terminal 4 is between V3 and V2 In FIG. 2, the output of the second inverter 7 rises close to "H" level, whereas the output of the first inverter 6 still remains at close to "L" level.

At this time, in the NOR 9, both of the P-MIS $9_2$ to which the output of the first inverter 6 is connected and the N-MIS $9_3$ to which the output of the second inverter 7 is connected are brought in on-state, and the output voltage of the NOR 9 takes on an intermediate potential determined by the ratio of a value obtained by adding on-resistances of the P-MIS $9_2$ and the P-MIS $9_1$ to an on-resistance of the N-MIS $9_3$. FIG. 2 also shows the output voltage of the NOR 9.

Figure 10:
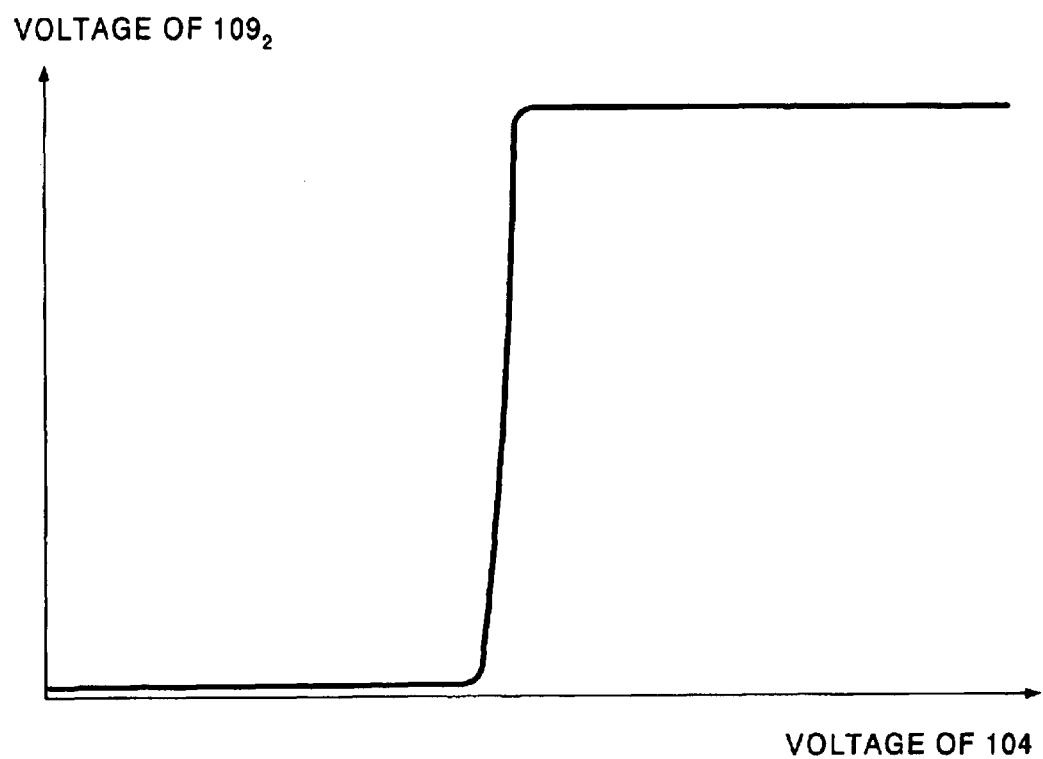
FIG. 10 is a third operation waveform diagram of the related complementary MIS output buffer circuit.
Figure 11:
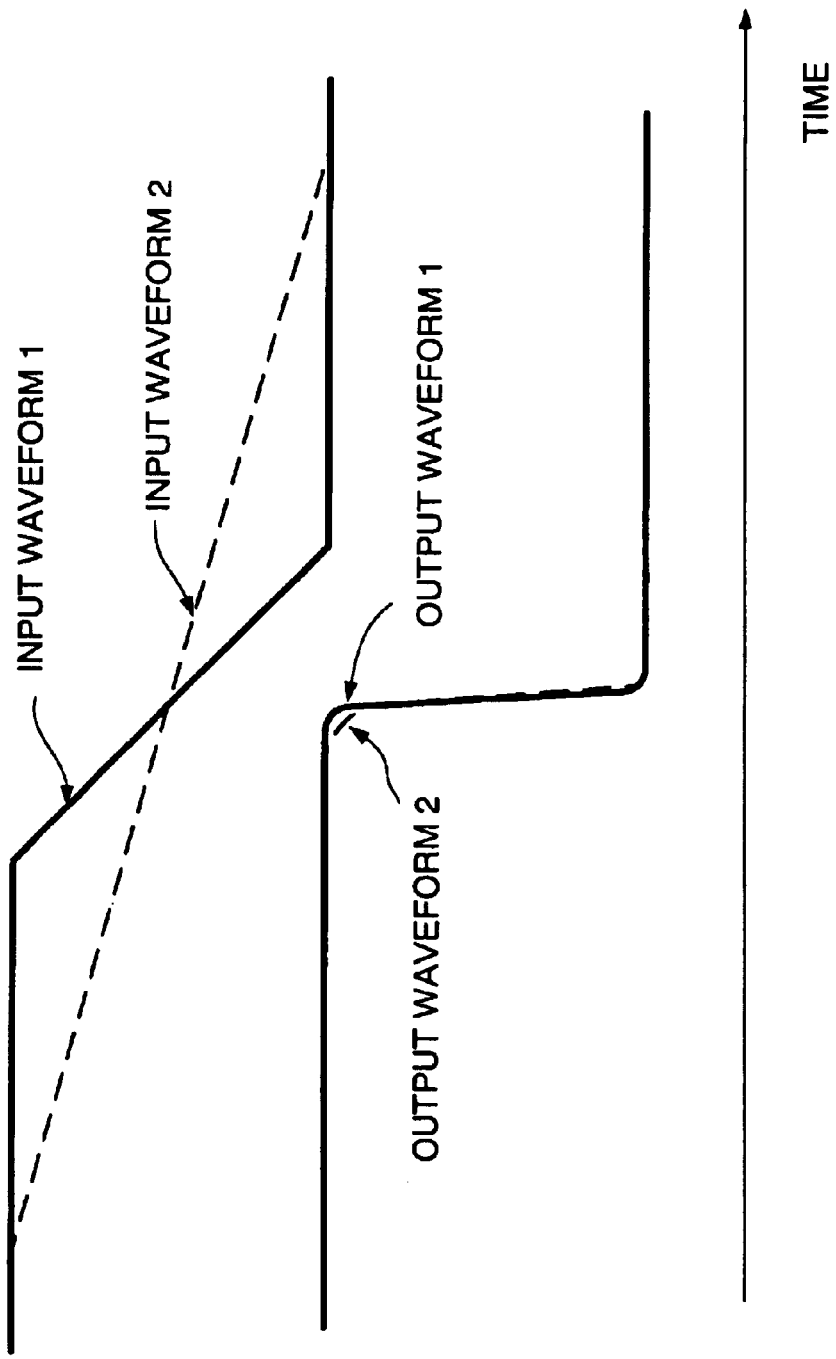
FIG. 11 is a fourth operation waveform diagram of the related complementary MIS output buffer circuit.
Figure 12:
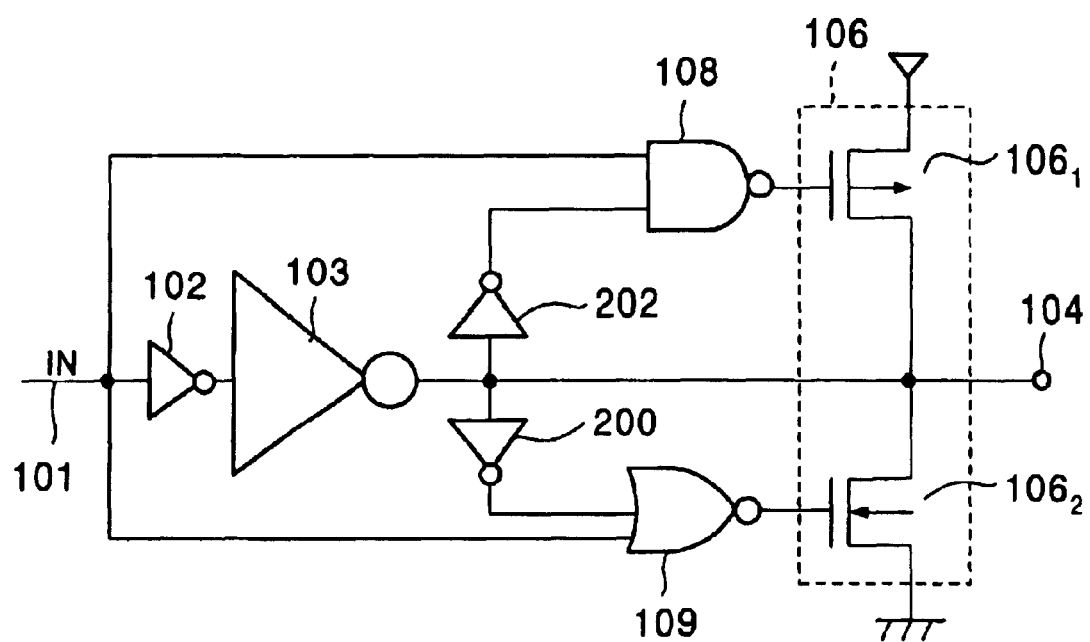
FIG. 12 is a circuit diagram of another related complementary MIS output buffer circuit.

Comparing the waveform of the output voltage of the NOR 9 in FIG. 2 and a waveform of the voltage of a related circuit shown in FIG. 10, the slope of the output voltage of the NOR 9 is very gentle. This means that the gain of the driving force control circuit from the output terminal 4 to the output of the NOR 9 is small. Hence, the output of the NOR 9 changes following the slope of the change of the output terminal 4.

Figure 3:
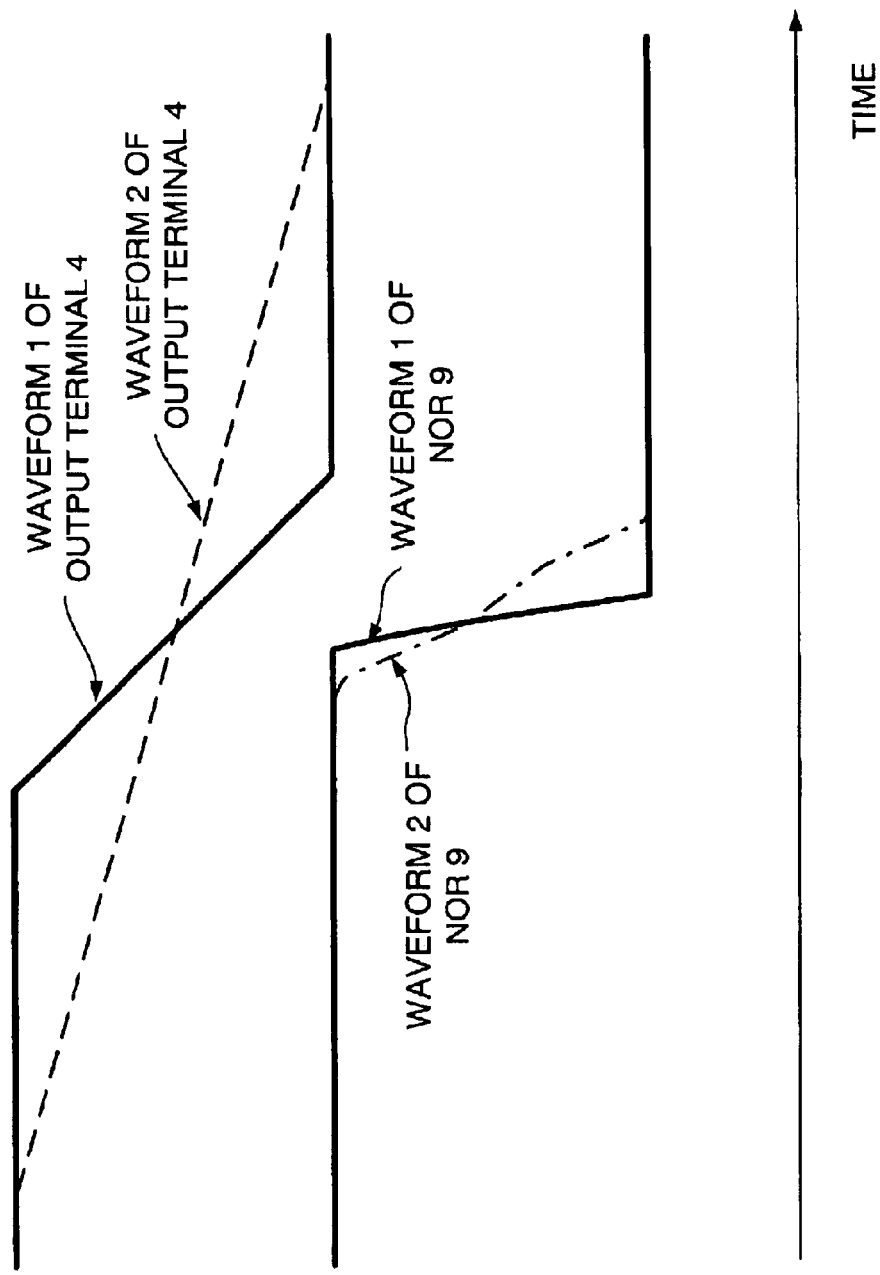
FIG. 3 is a second operation waveform diagram of the complementary MIS output buffer circuit according to the first embodiment.

FIG. 3 shows its effect. With respect to a waveform 1 of the output terminal 4 whose level change slope is steep, the output of the NOR 9 also changes rapidly as shown by an output waveform 1 of the NOR 9. On the other hand, with respect to a waveform 2 of the output terminal 4 whose level change slope is gentle, the output of the NOR 9 also changes slowly as shown by an output waveform 2 of the NOR 9.

Accordingly, the gate voltage of the N-MIS $5_2$ changes according to the slope of the change in the output signal of the output terminal 4, and the amount of a current flowing through the N-MIS $5_2$ changes according to the slope of the change in the output signal of the output terminal 4.

Namely, when the slope of the change in the output signal of the output terminal 4 is gentle, the current change rate of the output terminal 4 can be reduced, whereby the magnitude of the counter electromotive force is kept low, and the occurrence of oscillation during an output transition can be suppressed.

The NOR 9 which controls the N-MIS $5_2$ for enhancing fall driving force is explained above, and the NAND 8 which controls the P-MIS $5_1$ for enhancing rise driving force also performs the same operation with respect to the waveforms of the output terminal 4, and therefore its explanation is skipped herein.

As described above, according to this embodiment, the output slope of the driving force control circuit can be changed according to the slope of the change in the output signal of the buffer circuit. It is possible to realize the complementary MIS output buffer circuit capable of reducing excessive counter electromotive force accompanying switching of the driving assistant buffer which occurs when the slope of the change in the output signal is gentle and thereby reducing the occurrence of oscillation which occurs in the output during a transition.

(Second Embodiment)

Figure 4:
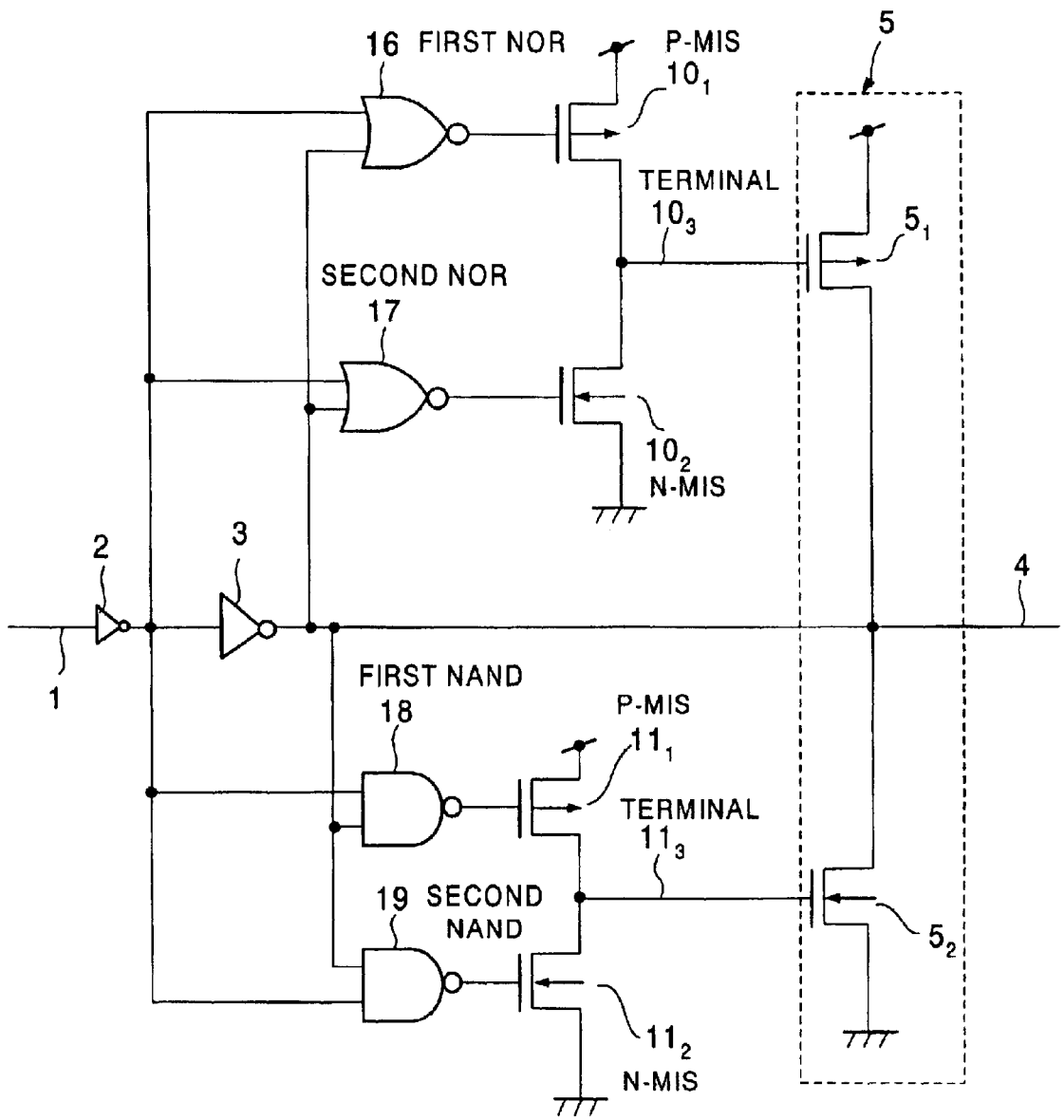
FIG. 4 is a circuit diagram of a complementary MIS output buffer circuit according to a second embodiment.

FIG. 4 is a circuit diagram of a complementary MIS output buffer circuit according to a second embodiment.

FIG. 4 is the same as FIG. 1 according to the first embodiment in that the input 1 is connected to the output terminal 4 via the subbuffer 2 and the main buffer 3 in sequence and the driving assistant buffer 5 including the P-MIS $5_1$ and the N-MIS $5_2$ is connected in parallel with the output terminal 4.

It is different from FIG. 1 in the configuration of each of driving force control circuits which control the P-MIS $5_1$ and the N-MIS $5_2$ by an output signal fed back from the output terminal 4.

The driving force control circuit which controls the P-MIS $5_1$ includes a first NOR 16 and a second NOR 17, to which both an output of the subbuffer 2 and the output terminal 4 are inputted, a P-MIS $10_1$ to whose gate terminal the first NOR 16 is connected, and an N-MIS $10_2$ to whose gate terminal the second NOR 17 is connected, and a terminal $10_3$ to which drain terminals of the P-MIS $10_1$ and the N-MIS $10_2$ are connected jointly is connected to a gate terminal of the P-MIS $5_1$.

On the other hand, the driving force control circuit which controls the N-MIS $5_2$ includes a first NAND 18 and a second NAND 19, to which both the output of the subbuffer 2 and the output terminal 4 are inputted, a P-MIS $11_1$ to whose gate terminal the first NAND 18 is connected, and an N-MIS $11_2$ to whose gate terminal the second NAND 19 is connected, and a terminal $11_3$ to which drain terminals of the P-MIS $11_1$ and the N-MIS $11_2$ are connected jointly is connected to a gate terminal of the N-MIS $5_2$.

The first NOR 16 and the second NOR 17 differ in logical threshold, and the logical threshold of the first NOR is designed to be lower than ½ VDD, and the logical threshold of the second NOR 17 is designed to be higher than ½ VDD.

Moreover, the first NAND 18 and the second NAND 19 are also designed in such a manner that the logical threshold of the first NAND 18 is lower than ½ VDD and the logical threshold of the second NAND 19 is higher than ½ VDD.

The operation of this embodiment will be explained below, and likewise with the explanation of the first embodiment, an explanation is also given with the circuit which controls the N-MIS $5_2$ for enhancing fall driving force as an example.

Even if the input 1 starts to change from "H" to "L" and the output of the subbuffer 2 changes from "L" to "H", the output terminal 4 remains "H", which is the immediately preceding output, for a while since an output of the main buffer 3 is delayed, and during this time, outputs of the first NAND 18 and the second NAND 19 are both "L". Accordingly, at this time, the P-MIS $11_1$ is turned on and the N-MIS $11_2$ is turned off, whereby the terminal $11_3$ becomes "H".

Thereafter, the output terminal 4 starts to change from "H" to "L", but since the logical threshold of the second NAND 19 is high and the logical threshold of the first NAND 18 is low, the output of the second NAND 19 starts to change to "H" earlier than that of the first NAND 18.

When the output of the second NAND 19 starts to change to "H", the N-MIS $11_2$ starts to be turned on, but since the output of the first NAND 18 remains "L" at this time, the P-MIS $11_1$ is also on. This situation continues until the output of the first NAND 18 changes to "H".

When both the P-MIS $11_1$ and the N-MIS $11_2$ are in the on-state, the voltage of the terminal $11_3$ takes on an intermediate potential determined by the ratio of an on-resistance of the P-MIS $11_1$ to that of the N-MIS $11_2$. A sight of the state of the voltage change of the terminal $11_3$ with respect to the voltage change of the output terminal 4 at this time indicates that the slope of the voltage change is very gentle similarly to the waveform of the NOR 9 of the first embodiment shown in FIG. 2. This means that the gain of the driving force control circuit from the output terminal 4 to the terminal $11_3$ is small, and its effect is the same as described in the explanation of the first embodiment.

Moreover, this embodiment has the effect of reducing the transistor size of the aforementioned driving force control circuit.

Generally, when such a buffer having large driving force as the driving assistant buffer 5 is used, a circuit located in the previous stage also needs driving force which is large to some extent, and hence it is required to increase its transistor size. When the circuit is a NOR or a NAND, the series transistor row of P-MISs and N-MISs exists in terms of its circuit configuration, and the on-resistance of the series transistor row increases in proportion to the number of stages thereof. To ensure the operation speed, it is necessary not to increase the on-resistance, and hence it is necessary to further increase the transistor size in proportion to the number of series stages.

Accordingly, when the circuit in the stage previous to the driving assistant buffer 5 has no series transistor row as described in this embodiment, it is unnecessary to increase the transistor size, which is effective in improvement in device density.

(Third Embodiment)

Figure 5:
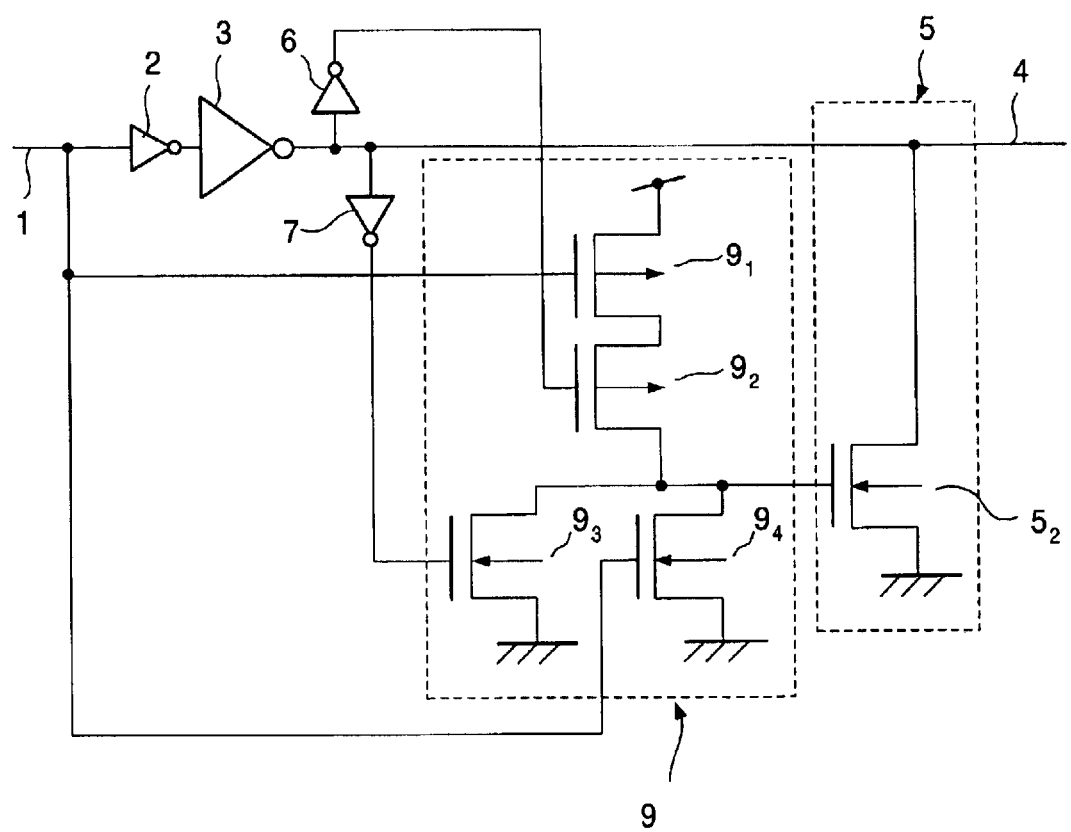
FIG. 5 is a circuit diagram of a complementary MIS output buffer circuit according to a third embodiment.
Figure 6:
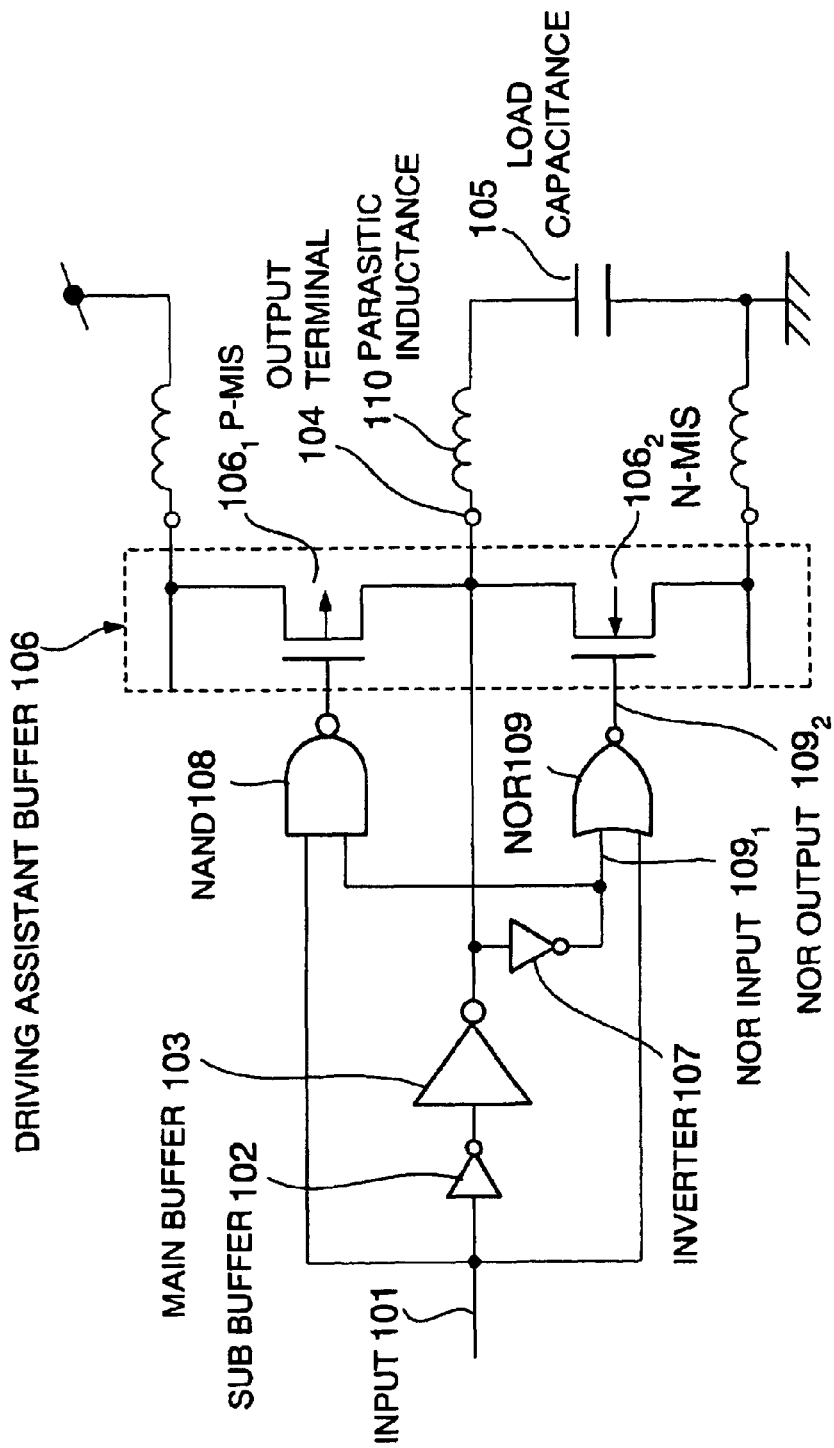
FIG. 6 is a circuit diagram of a related complementary MIS output buffer circuit.
Figure 7:
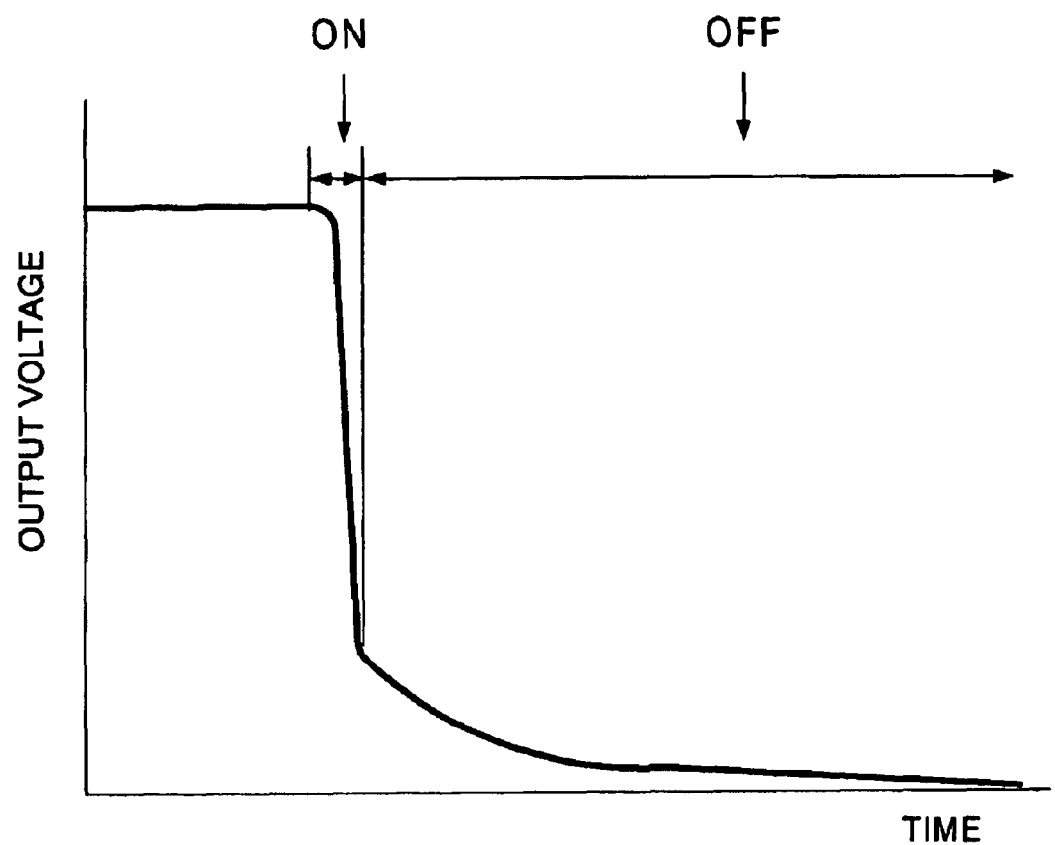
FIG. 7 is a first operation waveform diagram of the related complementary MIS output buffer circuit.
Figure 8:
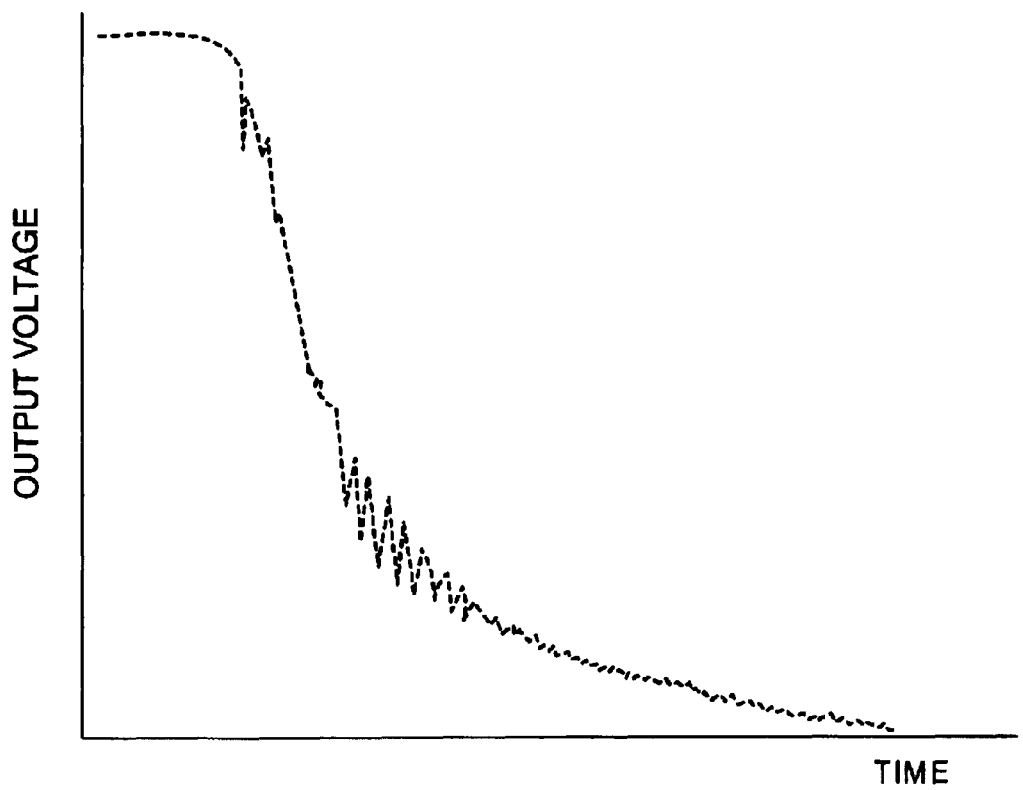
FIG. 8 is a second operation waveform diagram of the related complementary MIS output buffer circuit.
Figure 9:
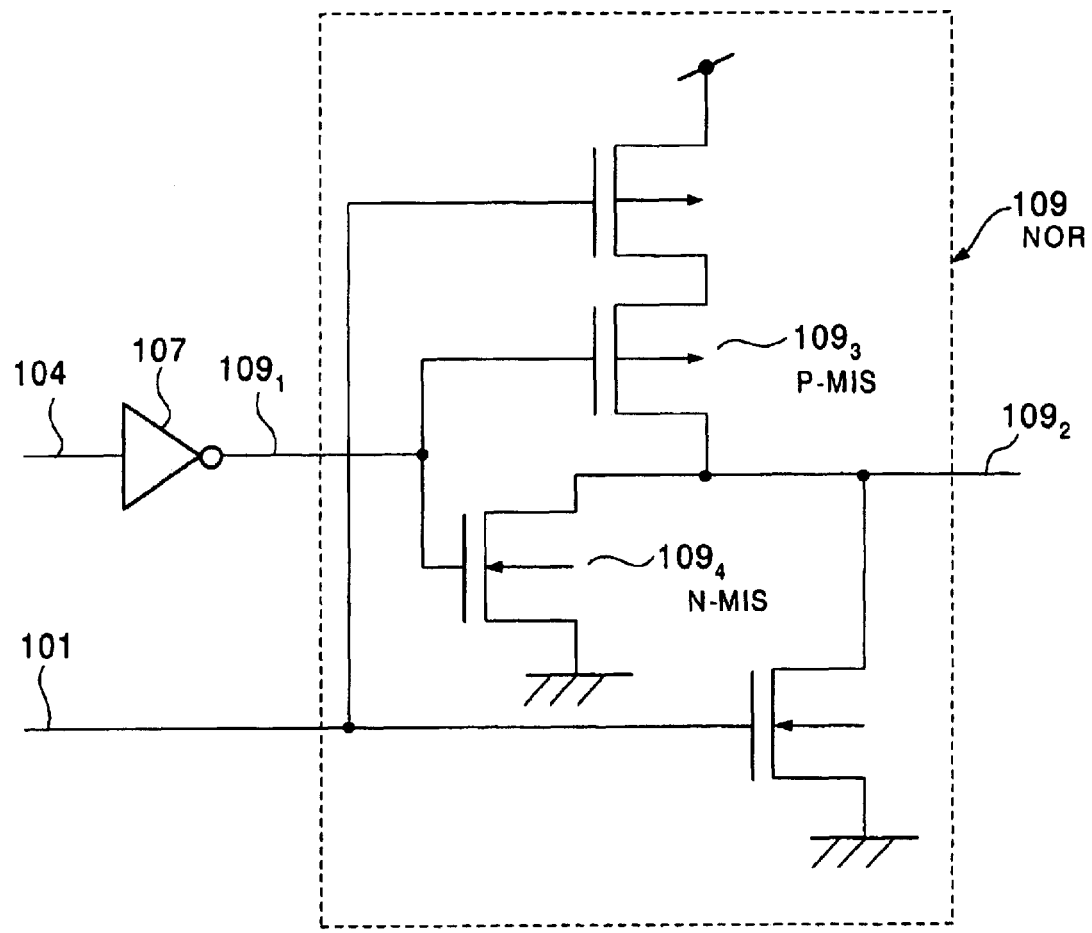
FIG. 9 is a circuit diagram of a portion extracted from the related complementary MIS output buffer circuit.

FIG. 5 is a circuit diagram of a complementary MIS output buffer circuit according to the third embodiment.

In the circuit in FIG. 5, the P-MIS $5_1$ and the NAND 8 associated with the enhancement of rise driving force are eliminated from the circuit in FIG. 1 according to the first embodiment. Moreover, since the operation of the circuit in FIG. 5 is the same as that of the circuit in FIG. 1 described in the explanation of the first embodiment, the explanation of the operation is omitted herein.

This embodiment is effective if it is used when the interface level specification of the output buffer is set on the side of a low level such as a TTL level.

The specification of the TTL level is biased to the very low potential side, that is, the maximum low potential level is 0.8 V and the minimum high potential level is 2.0 V. Accordingly, when the level of the output terminal 4 is changed from "H" to "L", it is necessary to rapidly make the level fall to 0.8 V or lower, and hence large driving force is needed. Simultaneously, noise such as ringing is not permitted to exceed 0.8 V, and thus it is difficult that large driving force and low noise are compatible with each other.

On the other hand, when the level of the output terminal 4 is changed from "L" to "H", it is only required to raise the level to 2.0 V, and hence large driving force is unneeded.

In such a case, the driving assistant buffer 5 needs only the N-MIS $5_2$. By eliminating unnecessary circuits according to the specification of the output level, the device area of the output buffer can be reduced.

What is claimed is:

1. An output buffer circuit, comprising:
   a buffer which is supplied with an input signal and which outputs an output signal from an output terminal;
   a driving assistant buffer which includes a first MISFET provided at one of a first position and a second position, the first position being between the output terminal and a first power supply and the second position being between the output terminal and a second power supply;

a first logic circuit which is connected to the output terminal and which has a first logical threshold, the first logic circuit configured to perform a logic operation based on the first logical threshold using the output signal so as to output a first logic signal;

a second logic circuit which is connected to the output terminal and which has a second logical threshold higher than the first logical threshold, the second logic circuit configured to perform the same logic operation as the first logic circuit based on the second logical threshold using the output signal so as to output a second logic signal; and a third logic circuit which is connected to a gate of the first MISFET and which outputs a control signal so as to control the first MISFET, the third logic circuit including a second MISFET of a P-channel and a third MISFET of an N-channel which are connected in series between a third power supply and a fourth power supply, the first logic signal being inputted to a gate of the second MISFET and the second logic signal being inputted to a gate of the third MISFET.

2. The output buffer circuit as set forth in claim 1, wherein both of the second MISFET and the third MISFET turn on for a given period during the first MISFET is changed from an off-state into an on-state.

3. The output buffer circuit as set forth in claim 1, wherein the driving assistant buffer further comprises a fourth MISFET provided at the other of the first position and the second position.

4. The output buffer circuit as set forth in claim 3, further comprising a fourth logic circuit which is connected to a gate of the fourth MISFET and which outputs a control signal so as to control the fourth MISFET, the fourth logic circuit including a fifth MISFET of a P-channel and a sixth MISFET of an N-channel which are connected in series between the third power supply and the fourth power supply, the first logic signal being inputted to a gate of the fifth MISFET and the second logic signal being inputted to a gate of the sixth MISFET.

5. The output buffer circuit as set forth in claim 4, wherein the first logic circuit is an inverter and the second logic circuit is also an inverter.

6. The output buffer circuit as set forth in claim 5, wherein the first MISFET is of N-channel and the fourth MISFET is of P-channel.

7. The output buffer circuit as set forth in claim 4, wherein the third logic circuit further comprises:

a seventh MISFET which is connected in series to the second MISFET and which is of a P-channel, the input signal being inputted to a gate of the seventh MISFET; and a eighth MISFET which is connected in parallel to the third MISFET and which is of an N-channel, the input signal being inputted to a gate of the eight MISFET, and the forth logic circuit further comprises:

a ninth MISFET which is connected in parallel to the fifth MISFET and which is of a P-channel, the input signal being inputted to a gate of the ninth MISFET; and a tenth MISFET which is connected in series to the sixth MISFET and which is of an N-channel, the input signal being inputted to a gate of the tenth MISFET.

8. The output buffer circuit as set forth in claim 1, wherein the first logic circuit is a NAND circuit and the second logic circuit is also a NAIND circuit.

9. The output buffer circuit as set forth in claim 8, wherein the output signal and an inverted signal of the input signal are inputted to the first logic circuit and the second logic circuit.

10. The output buffer circuit as set forth in claim 1, wherein the first logic circuit is a NOR circuit and the second logic circuit is also a NOR circuit.

11. The output buffer circuit as set forth in claim 10, wherein the output signal and an inverted signal of the input signal are inputted to the first logic circuit and the second logic circuit.

12. The output buffer circuit as set forth in claim 3, further comprising:

a fifth logic circuit which is connected to the output terminal and which has a third logical threshold, the third logic circuit configured to perform a logic operation based on the third logical threshold using the output signal so as to output a third logic signal;

a sixth logic circuit which is connected to the output terminal and which has a fourth logical threshold higher than the third logical threshold, the fourth logic circuit configured to perform the same logic operation as the fifth logic circuit based on the fourth logical threshold using the output signal so as to output a fourth logic signal; and a seventh logic circuit which is connected to a gate of the fourth MISFET and which outputs a control signal so as to control the fourth MISFET, the seventh logic circuit including an eleventh MISFET of a P-channel and a twelfth MISFET of an N-channel which are connected in series between the third power supply and the fourth power supply, the third logic signal being inputted to a gate of the eleventh MISFET and the fourth logic signal being inputted to a gate of the twelfth MISFET.

13. The output buffer circuit as set forth in claim 12, wherein the first logic circuit is a NAND circuit and the second logic circuit is also a NAND circuit, but the fifth logic circuit is a NOR circuit and the sixth logic circuit is also a NOR circuit, and the output signal and an inverted signal of the input signal are inputted to the first logic circuit, the second logic circuit, the fifth logic circuit and the sixth logic circuit.

14. The output buffer circuit as set forth in claim 1, wherein a voltage of the second power supply and a voltage of the fourth power supply are lower than a voltage of the first power supply and a voltage of the third power supply.

15. The output buffer circuit as set forth in claim 14, wherein the voltage of the first power supply and the voltage of the third power supply are a power supply voltage, and the voltage of the second power supply and the voltage of the fourth power supply are a ground.

16. The output buffer circuit as set forth in claim 1, wherein the input signal is inputted to the third logic circuit so as to control outputting the control signal from the third logic circuit.

17. The output buffer circuit as set forth in claim 1, wherein the control signal outputted from the third logic circuit is directly inputted to the first MISFET.

* * * * *